United States Patent [19]
Abe

[11] Patent Number: 5,359,298
[45] Date of Patent: Oct. 25, 1994

[54] VCO HAVING VOLTAGE-TO-CURRENT CONVERTER AND PLL USING SAME

[75] Inventor: Akira Abe, Suwa, Japan

[73] Assignee: Seiko Epson Corporation, Tokyo, Japan

[21] Appl. No.: 174,974

[22] Filed: Dec. 29, 1993

Related U.S. Application Data

[63] Continuation of Ser. No. 862,581, Aug. 20, 1992, Pat. No. 5,302,919.

[30] Foreign Application Priority Data

Oct. 23, 1990 [JP] Japan ................................ 2-285233
May 14, 1991 [JP] Japan ................................ 3-109121

[51] Int. Cl.$^5$ ..................... H03K 3/354; H03L 7/07; H03L 7/099
[52] U.S. Cl. ........................... 331/2; 331/14; 331/17; 331/34; 331/57; 331/108 B; 331/177 R
[58] Field of Search .................. 331/2, 14, 17, 34, 57, 331/108 B, 177 R

[56] References Cited

U.S. PATENT DOCUMENTS

| | | | |
|---|---|---|---|
| 4,862,015 | 8/1989 | Grandfield | 307/270 |
| 5,036,216 | 7/1991 | Hohmann et al. | 309/269 |
| 5,075,639 | 12/1991 | Taya | 331/2 |

FOREIGN PATENT DOCUMENTS

| | | |
|---|---|---|
| 59-28209 | 2/1984 | Japan. |
| 60-183818 | 9/1985 | Japan. |
| 62-204615 | 9/1987 | Japan. |
| 63-40371 | 8/1988 | Japan. |

*Primary Examiner*—Siegfried H. Grimm
*Attorney, Agent, or Firm*—Eric B. Janofsky

[57] ABSTRACT

The voltage controlled oscillator in a phase-locked loop comprises a voltage-current converter (62) and a current frequency converter (34). The voltage-current converter (62) comprises a voltage differential-current converter (64), a current-current converter (66) and a current adder-subtracter (68). In the voltage differential-current converter (64), only the voltage fluctuation or difference $\Delta V_{CN}$ with respect to one half a power supply voltage $V_{DD}/2$, and not the absolute value of a control voltage $V_{CN}$, undergoes current conversion as a control current $I_{CN}$. Therefore, the center frequency of the oscillation frequency is not a factor of control voltage $V_{CN}$ and is controlled only by an offset voltage $V_{B2}$. Accordingly, the center frequency can be independently set by changing offset voltage $V_{B2}$. This is particularly significant in zone bit recording, which requires a wide frequency band.

4 Claims, 5 Drawing Sheets

VCO HAVING VOLTAGE-TO-CURRENT CONVERTER AND PLL USING SAME

This is a continuation, of application Ser. No. 07/862,581 filed on Aug. 20, 1992 now U.S. Pat. No. 5,302,919.

BACKGROUND OF THE INVENTION

1. Field of the Invention The present invention generally relates to phase-locked loops (PLL) used for zone bit recording in hard disk systems, for example, and more particularly to improvement of the voltage-controlled oscillator (VCO) portion of the phase-locked loop.

2. Related Technical Art

Figure 4:
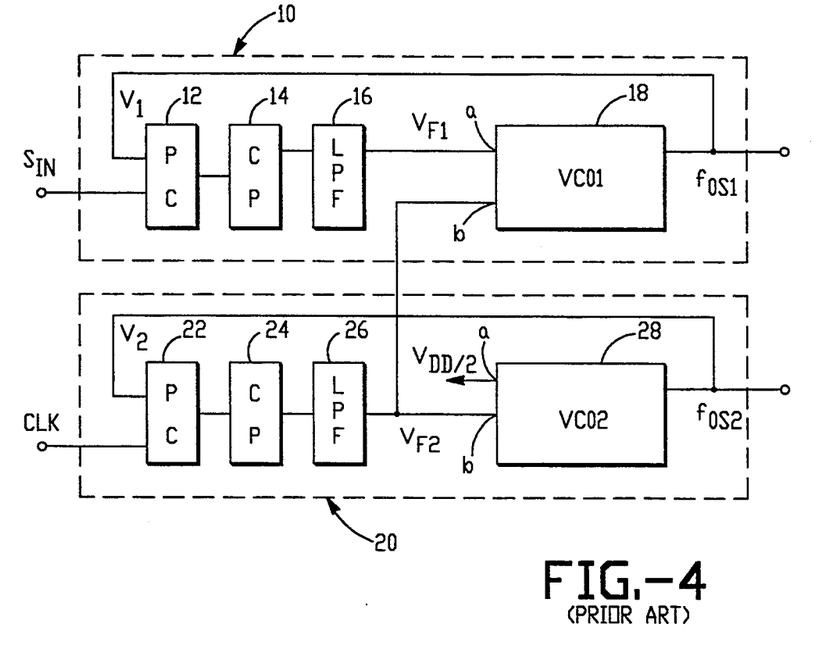
FIG. 4 is a block diagram showing a phase-locked loop of the prior art.
Figure 5:
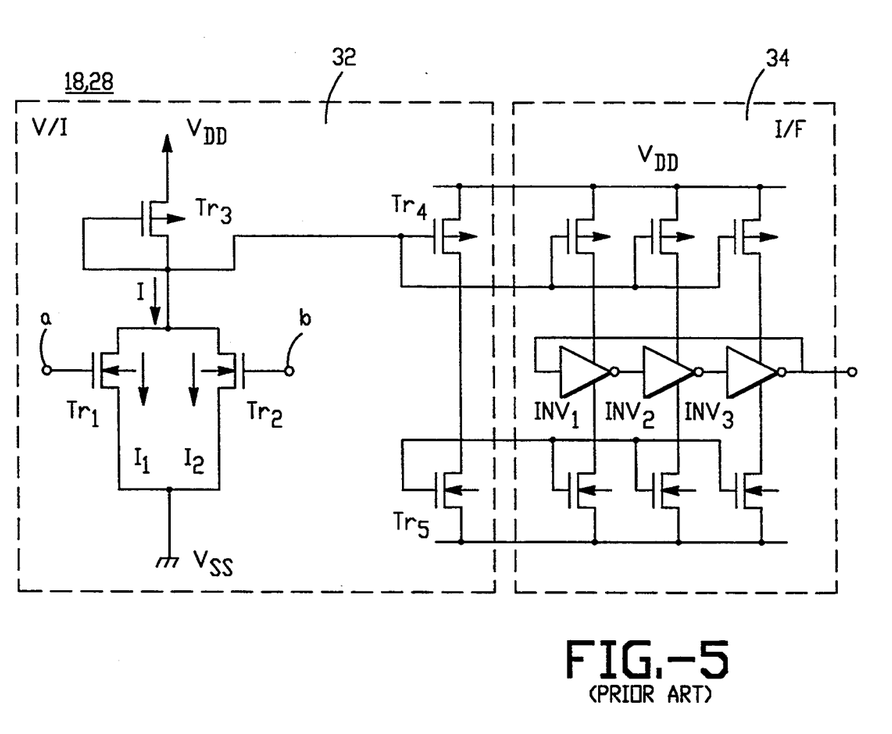
FIG. 5 is a circuit diagram showing a configuration for the voltage-controlled oscillator of the prior art example of FIG. 4.

Currently, phase-locked loops widely used in magnetic disk devices and other types of data separators comprise a first phase-locked loop operating in synchronization with a data pulse and a second phase-locked loop operating in synchronization with a reference clock, as disclosed in Japanese Laid-Open Patent Publication 59-28209, which was configured to be locked in at a high speed or quickly regardless of whether the data transfer rate changed. This type of phase-locked loop had a configuration as shown in FIG. 4. That is, a first phase-locked loop 10 used a phase comparator (PC) 12 to compare the phases of a data pulse string $S_{IN}$ and an oscillator output $V_1$, and outputs a phase difference detection signal, a charge pump 14 that provider current to be charged and discharged to a loop filter 16, acting as a low-pass filter (LPF), in a subsequent stage based on the phase difference detection signal, and a voltage-controlled oscillator (VCO1) 18 in which an oscillation frequency $f_{OS1}$ was controlled by a control voltage $V_{F1}$, output by loop filter 16. A second phase-locked loop 20 used a phase comparator (PC) 22 to compare the phases of a reference clock CLK and an oscillator output $V_2$ and output a phase detection signal. A charge pump 24 that provider the current to be charged and discharged to the loop filter 26, acting as a low-pass filter (LPF), in a subsequent stage based on the second phase detection signal, and a voltage-controlled oscillator (VCO2) 28 in which an oscillation frequency $f_{OS2}$ was controlled in response to a control voltage $V_{F2}$, output by loop filter 26, were also used. The voltage-controlled oscillators 18 and 28 are each circuits with characteristic constants equal to each other, and each has a control input terminal a and an offset voltage (reference voltage) terminal b. Output $VF_1$ Of loop filter 16 and output $VF_2$ of loop filter 26 Of second phase-locked loop 20 are impressed on control input terminal a and offset voltage (reference voltage) terminal b, respectively, of voltage-controlled oscillator 18 of first phase-locked loop 10. An intermediate voltage $V_{DD}/2$ (DC voltage) of a power source voltage $V_{DD}$ and output $VF_2$ of loop filter 26 are impressed on control input terminal a and offset voltage terminal b, respectively, of voltage-controlled oscillator 28 of second phase-locked loop 20. Voltage-controlled oscillators 18 and 28 each use, as shown in FIG. 5, a voltage-current converter (V/I) 32 and a current frequency converter (I/F) 34. Voltage-current converter 32 comprises a parallel current path made using a MOS transistor $Tr_1$ which is current-controlled by the voltage impressed on control input terminal a and a MOS transistor $Tr_2$ which is current-controlled by the voltage impressed on offset voltage terminal b, a load MOS transistor $Tr_3$ connected in series with this parallel current path, an output transistor $Tr_4$, which acts as a current mirror circuit and uses load MOS transistor $Tr_3$ as its input transistor, and a load MOS transistor $Tr_5$ connected in series to transistor $Tr_4$. Current frequency converter (I/F) 34 is a commonly used ring oscillator having three stages of inverters designated here as $INV_1$–$INV_3$. In only the first phase-locked loop 10, locking occurs when input of a data pulse string starts, and a considerable amount of time is required until control voltage $V_{F1}$, output by loop filter 16, reaches approximately $V_{DD}/2$, but by adding a reference clock CLK to second phase-locked loop 20 in advance to preset it to a locked condition and supplying output $VF_2$ of loop filter 26 to offset voltage terminal b of voltage-controlled oscillator 18 in first phase-locked loop 10, first phase-locked loop 10 is locked in at high speed regardless of whether the data transfer rate changes.

However, phase-locked loops having the above configuration present the following problems.

(1) If control voltage $V_{F1}$, output by loop filter 16 in first phase-locked loop 10, is $V_{DD}/2$ (locked condition of first phase-locked loop 10), the added current (combined current) I of the current (control current) $I_1$ controlled by control voltage $V_{F1}$ and flowing to transistor $Tr_1$, and the current (offset current) $I_2$ controlled by offset voltage $VF_2$ and flowing, to transistor $Tr_2$ are generated, and a current proportioned to added current I is supplied to current frequency converter 34. That is, an oscillation frequency $f_{OS1}$ of voltage-controlled oscillator 18 is determined by the sum of control current $I_1$ and offset current $I_2$. Since control voltage $VF_1$ oscillates up and down with one-half the power source voltage $V_{DD}$ as a reference, the center frequency is determined by the sum of control current $I_1$, as determined by $V_{DD}/2$, and offset current $I_2$, even when there is no phase difference (locked condition). Therefore, the band of the center frequency expands very much even when the offset voltage is changed. This is due to the fact that even when the offset current is narrowed down in order to lower the center frequency, control current $I_1$, as determined by $V_{DD}/2$ in a locked condition, is already flowing.

In zone bit recording in hard disk systems, etc., a data pulse string $S_{IN}$ is generated at data transfer rates of four zones ($f_1=8$ MHz, $f_2=10$ MHz, $f_3=12$ MHz, $f_4=14$ MHz) and the data transfer rate is changed by switching among these four rates. Phase-locked loops such as that described above cannot be applied to systems requiring a wide range of data transfer rates such as this. This is due to the fact that the band width of the center frequency is too narrow, and it is not a control system that can freely vary the center frequency. Therefore, a phase-locked loop that can follow a wide range of data transfer rates for a data pulse string has been desired.

(2) Generally, when the loop filter is a lag-lead filter comprising a series circuit made up of a resistance R and a capacitor C, the following two equations are extremely important as equations that describe the basic characteristics of the phase-locked loop.

$$\omega_n = (K_v K_c / C)^{\frac{1}{2}} \tag{1}$$

$$\zeta = CR\omega_n/2 \tag{2}$$

where, $\omega_n$ is the natural frequency (characteristic frequency) $\zeta$ is the damping coefficient (damping factor), $K_v$ is a voltage frequency conversion coefficient of the voltage-controlled oscillator, and $K_c$ is a conversion coefficient including the phase comparator and the charge pump. When a phase-locked loop is applied to a data separator circuit of a magnetic storage device, etc., it is necessary to change the natural frequency $\omega_n$ in proportion to the data transfer rate when the data transfer rate changes. The damping coefficient $\zeta$, on the other hand, must remain a fixed value regardless of the data transfer rate. This is important from the standpoint of the phase step response and peak shift margin characteristic of the phase-locked loop. Therefore, when the data transfer rate is low (when the center frequency is low), the voltage frequency conversion coefficient $K_v$ of the voltage-controlled oscillator 18 must be lowered, and when the data transfer rate is high (when the center frequency is high), the voltage frequency conversion coefficient $K_v$ must be raised. However, in the voltage-controlled oscillators 18 and 28 of the above phase-locked loop, the voltage frequency conversion coefficient $K_v$ is fixed due to the physical dimensional ratio of transistor $Tr_1$ for the control current and transistor $Tr_2$ for the offset current, and, therefore, the voltage frequency conversion coefficient $K_v$ cannot be linked to the data transfer rate.

(3) Since the above phase-locked loop is locked into high speed when input of the data pulse string starts, a configuration is employed that adds a second phase-locked loop 20, whereby, if control input voltage $V_{F1}$ of voltage-controlled oscillator 18 of first phase-locked loop 10 is equal to control input voltage $V_{DD}/2$ of voltage-controlled oscillator 28 of second phase-locked loop 20, the oscillation frequencies become equal to each other.

Figure 6:
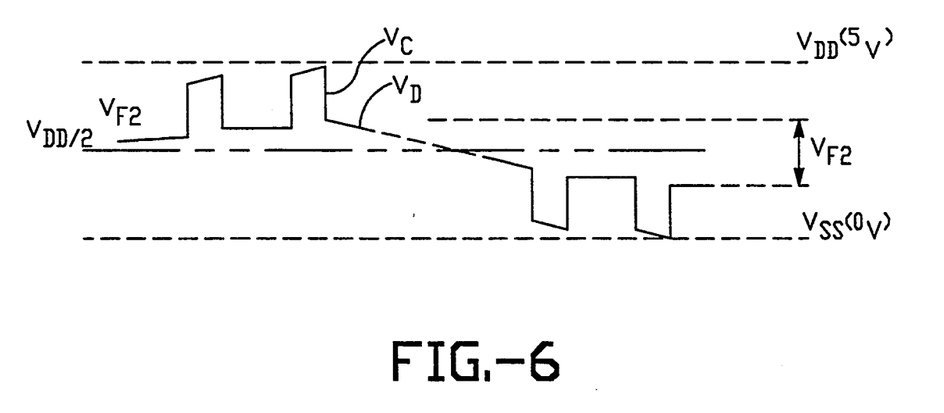
FIG. 6 is a waveform chart showing the output of the loop filter of the second phase-locked loop in the prior art example of FIG. 4.

In zone bit recording, the frequency of the reference clock CLK input to phase comparator 22 of second phase-locked loop 20 must be changed according to the corresponding data transfer rate, in which case, the oscillation frequency of voltage-controlled oscillator 28 is synchronized to the frequency of reference clock CLK, and output voltage $VF_2$ of loop filter 26, i.e., value of the offset input voltage of voltage-controlled oscillator 18, becomes different from previous zones. However, as shown in FIG. 6, offset input voltage $VF_2$ has a waveform that superposes an AC voltage component (pulse) $V_C$ corresponding to the charge-discharge period on the DC voltage component $V_D$ corresponding to an integrating action of the loop filter, and, therefore, DC voltage component $V_D$ cannot be freely changed without restriction over the entire range $(0-V_{DD})$ of the power source voltage. This is because since AC voltage component (pulse) $V_C$ generated by the charging and discharging of charge pump 24 corresponds to the phase difference detection signal, when DC voltage component $V_D$ approaches $V_{DD}$ or $V_{SS}$ (ground potential), which are far removed from $V_{DD}/2$, the AC voltage component (pulse) $V_C$ is clipped at a top or bottom limit and the control information for phase locking is corrupted. Therefore, the area of change for DC component $V_D$ of the output of loop filter 26 is limited to a neighborhood range extending above and below the reference $V_{DD}/2$, and for this reason it is impossible to accommodate a wide range of data transfer rates.

Furthermore, the output of loop filter 26 is not only used to accommodate differing data transfer rates, it is also supplied to offset input b of voltage-controlled oscillator 18 to compensate for fluctuations in the power source voltage and the ambient temperature, and to automatically correct for error factors such as production deviations. Therefore, it is necessary to allow for a margin in the variable range to automatically correct the output of loop filter 26, but since the variable range of DC voltage component $V_D$ is limited to the neighborhood of $V_{DD}/2$, temperature compensation and correction of errors due to production deviations, etc., are not sufficient.

In view of these problems, the invention is intended to offer a voltage-controlled oscillator and phase-locked loop capable of locking the oscillation frequency by changing the reference clock to accommodate large changes in the data transfer rate.

SUMMARY OF THE INVENTION

The invention comprises a voltage-current conversion element that generates an output current corresponding to the level of the input voltage and a current frequency conversion element that generates an oscillation frequency output corresponding to the level of the converted current, wherein the voltage-current conversion element comprises a voltage differential-current conversion element that uses the input voltage as a first input voltage and converts it to a current corresponding to the voltage difference between the input voltage and a reference voltage, and a current adder-subtracter element that generates a second current corresponding to a second input voltage and generates the converted current by adding or subtracting the first current based on the current generated by the voltage differential-current conversion element and the second current. Using this configuration, since a current corresponding to fluctuations in the first input voltage is generated, the center frequency does not become a factor of the first input voltage and is controlled only by the second input voltage. Therefore, the center frequency can be set independently by changing the second input voltage. This is particularly significant in zone bit recording, which requires a wide frequency band. Further, the circuit voltage-frequency characteristic can be made linear, thus making it easy to match design levels and actual operating levels. Though it depends on the circuit design of the voltage-current conversion element, instead of disposing the current frequency conversion element directly in series with the voltage differential-current conversion element, a current-current conversion element that generates a first current proportional to the current generated by the voltage differential-current conversion element may be disposed between the voltage differential-current conversion element and the current frequency conversion element.

In addition to the above configurations, a configuration may be employed that provides an integrating element which compares the first input voltage with the reference voltage, integrates the difference, and that supplies the output of the integrating element as the second input voltage. In this case, the second input voltage does not saturate, and, therefore, a phase-locked loop can be realized capable of following a wide frequency range.

The above voltage-controlled oscillator is suitable for application as a voltage-controlled oscillator in a phase-locked loop having a first phase-locked loop operating in synchronization with the data pulse string and a second phase-locked loop operating in synchronization with the reference clock. In this case, it is desirable to provide an integrating element in the second phase-locked loop that compares the first input voltage with the reference voltage and integrates the difference.

PREFERRED EMBODIMENTS FOR IMPLEMENTING THE INVENTION

Embodiments of the invention are explained below based on the attached figures.

First Embodiment

Figure 1:
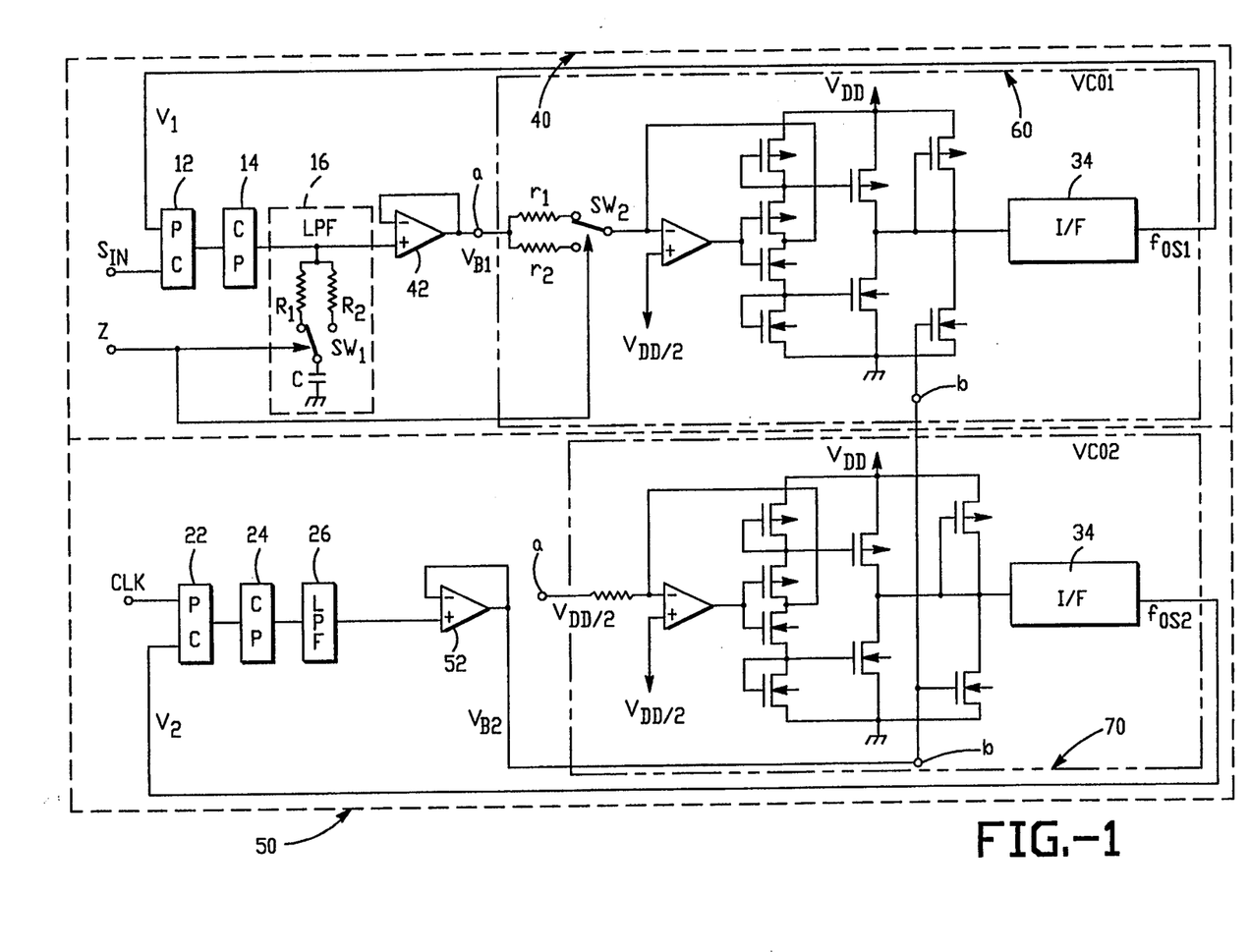
FIG. 1 is a circuit diagram showing an overall configuration of a first embodiment of the phase-locked loop of the invention.

FIG. 1 is a circuit diagram showing a phase-locked loop constructed and operating according a first embodiment of the invention. This phase-locked loop comprises, as in the prior art, a first phase-locked loop 40 operating in synchronization with a data pulse string $S_{IN}$ and a second phase-locked loop 50 operating in synchronization with a reference clock CLK.

The first phase-locked loop 40 uses a phase comparator (PC) 12, which compares the phases of data pulse string $S_{IN}$ and an oscillation output $V_1$ and outputs a phase difference detection signal, a charge pump 14, to provide current to be charged and discharged to a loop filter (LPF) 16, acting as a low-pass filter, in the next stage based on the detection signal, loop filter 16 being formed by a capacitor C and a switch $SW_1$, for switching between serial connections of resistances $R_1$ and $R_2$ to capacitor C based on a zone switching signal Z. A voltage-follower buffer 42, which receives the output voltage of loop filter 16 as input and outputs a voltage equal to it, and a voltage-controlled oscillator (VCO 1) 60, which is controlled to produce the oscillation frequency $f_{OS1}$ based on a control voltage $V_{B1}$ output from buffer 42 are also used. The second phase-locked loop 50 comprises a phase comparator (PC) 22, which compares the phases of the reference clock CLK and an oscillation output $V_2$ and outputs a phase difference detection signal, a charge pump 24, which provides the current to be charged and discharged to loop filter (LPF) 26, acting as a low-pass filter, in the next stage based on the detection signal, the commonly used loop filter 26 (LPF), being a series circuit being formed by a capacitor and resistance, a voltage-follower buffer 52, which receives the output voltage of loop filter 26 as an input and outputs a voltage equal to it, and a voltage-controlled oscillator (VCO2) 70, which is controlled to produce oscillation frequency $f_{OS2}$ based on an intermediate voltage $1/V_{DD}$ of the power source voltage $V_{DD}$.

Voltage-controlled oscillators 60 and 70 are circuits with characteristic constants equal to each other, and each has a control input terminal a and an offset voltage (reference voltage) terminal b. A buffer output $V_{B1}$ is impressed on control input terminal a and a buffer output $V_{B2}$ in second phase-locked loop 50 is impressed on offset voltage (reference voltage) terminal b of voltage-controlled oscillator 60 in first phase-locked loop 40. The intermediate voltage $V_{DD}/2$ (DC voltage) of power source voltage VD D is impressed on control input terminal a and buffer output $V_{B2}$ is impressed on offset voltage terminal b of voltage-controlled oscillator 70 of second phase-locked loop 50. Buffer 52 in second locked loop 50 can be omitted because the input of voltage-controlled oscillator 70 receiving loop filter 26 output is high impedance. This phase-locked loop differs from the prior art in the configuration of voltage-controlled oscillators 60 and 70. Voltage-controlled oscillators 60 and 70 have a similar configuration except for resistances $r_1$ and $r_2$ and a switch $SW_2$. The configuration of only voltage-controlled oscillator 60 is explained here by referring to FIG. 2. Voltage-controlled oscillator 60 comprises a voltage-current converter (V/I) 62 and a current frequency converter (I/F) 34. Current frequency converter 34 is a commonly used ring oscillator, as in the prior art, and as described below, has three inverted stages here designated $INV_1$–$INV_3$.

Figure 2:
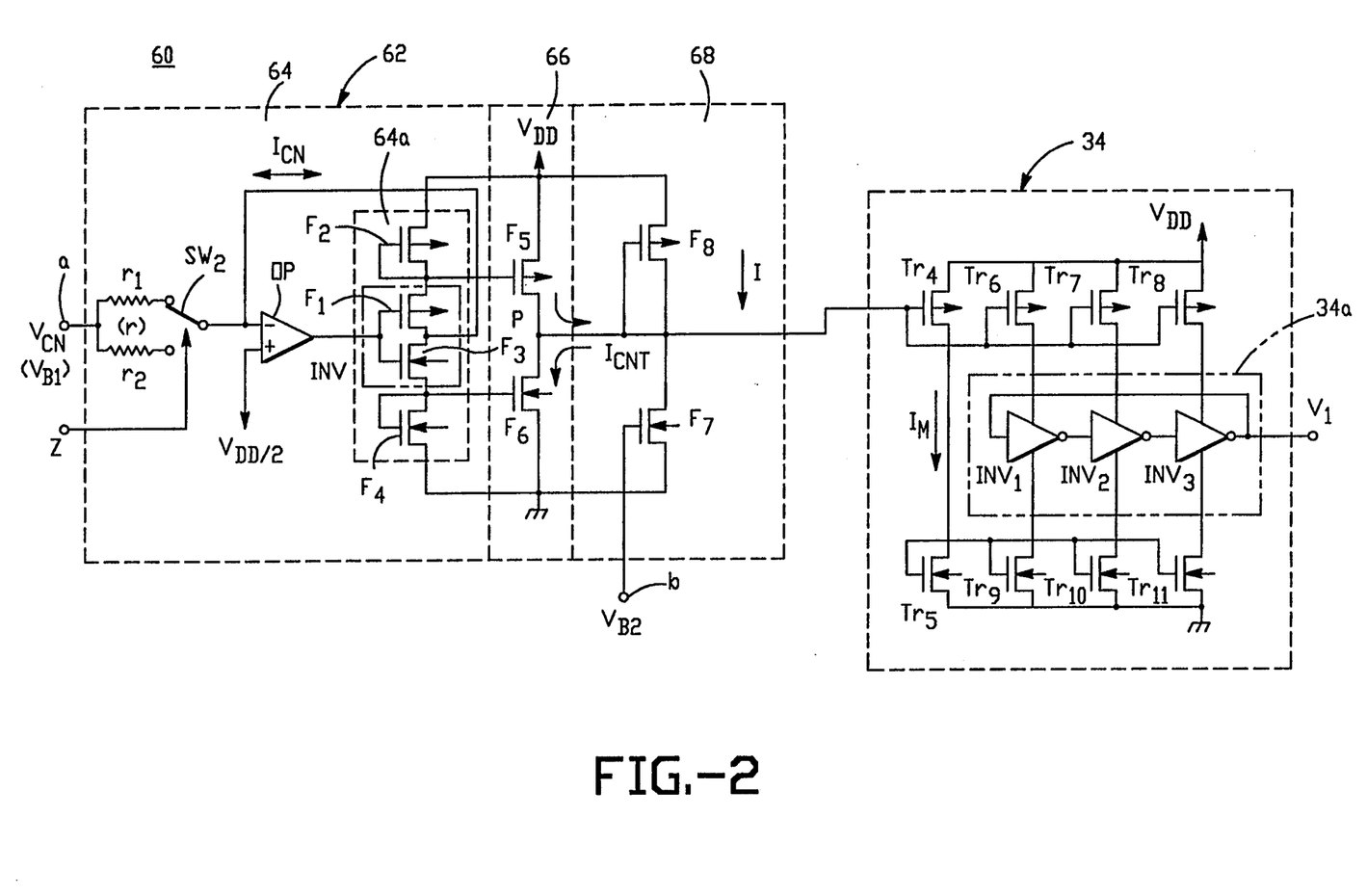
FIG. 2 is a circuit diagram showing the voltage-controlled oscillator of the embodiment of FIG. 1.

Voltage-current converter 62 comprises a voltage differential-current converter 64, a current-current converter 66 and a current adder-subtracter 68. Voltage differential-current converter 64 provides a current proportional to the voltage difference between buffer output voltage $V_{B1}$ and one-half the voltage of power source voltage $V_{DD}$. Converter 64 comprises an operational amplifier (OP) having a noninverting input terminal that receives buffer output voltage $V_{B1}$ via resistance r (switched resistance $r_1$ or $r_2$) and an inverting input terminal connected to and receiving a direct current that is one-half (compared voltage) power source voltage $V_{DD}$, and an inverting circuit 64a that receives the output of operational amplifier OP as an input and feeds its output back to the noninverting input terminal of the operational amplifier OP. Inverting circuit 64a comprises a CMOS inverter INV, a load MOS transistor $F_2$ for a p-type MOS transistor $F_1$ of the CMOS inverted INV, and a load MOS transistor $F_4$ for an n-type MOS transistor $F_3$ of the CMOS inverter INV. Current-current converter 66 receives converted current from voltage differential-current converter 64, and is a series circuit comprising a p-type MOS transistor $F_5$ dimensionally similar to the load MOS transistor $F_2$ and forms a current mirror, and an n-type MOS transistor $F_6$ dimensionally similar to the load MOS transistor $F_4$ and also forming a current mirror. Current adder-subtracter 68 is disposed between an output point P of current-current converter 66 and the power source voltage (ground potential), and is a series circuit comprising an offset control transistor $F_7$ current-controlled by offset voltage $V_{B2}$ impressed on offset control terminal b and a load MOS transistor $F_8$ disposed between output point P and the power source voltage ($V_{DD}$ potential).

Current frequency converter 34 comprises a transistor $Tr_4$ which constitutes a current mirror with transistor $F_8$ of current adder-subtracter 68, a load MOS transistor $Tr_5$ connected in series with transistor $Tr_4$, a ring oscillator 34a having three inverters $INV_1$–$INV_3$ connected in a ring, a set of transistors $Tr_6$–$Tr_8$ which constitute a parallel current mirror together with transistor $F_8$ and supply the prescribed charging current to each of the inverters $INV_1$–$INV_3$, and a set of transistors Tr9–Tr11 which constitute a current mirror with transistor F8 and transfer the prescribed discharging current from each of the inverters INV1–INV3. In a phase-locked loop having the above configuration, a buffer output voltage $V_{CN}$ equal to output voltage $V_{B1}$ of loop filter 16 is output supplied to control terminal a, but since the output of inverting circuit 64 in the next stage is fed back to the noninverting input terminal of operational amplifier OP, the operational amplifier constitutes a negative-feedback circuit. Therefore, operational amplifier OP operates to make the noninverted input voltage of operational amplifier OP equal to the inverted input voltage ($V_{DD}/2$) by means of an imaginary short circuit. Here, assuming the control current flowing through resistance r is $I_{CN}$, then:

$$I_{CN} = (V_{CN} - V_{DD}/2)/r \quad (1)$$

Since the control voltage $V_{CN}$ fluctuates between positive and negative based on $V_{DD}/2$ as a reference, then $V_{CN}$ can be expressed as:

$$V_{CN} = V_{DD}/2 \pm |\Delta V_{CN}| \quad (2)$$

where, $\Delta V_{CN}$ is the voltage fluctuation. When equation (2) is substituted into equation (1), then:

$$I_{CN} \pm |\Delta V_{CN}|/r \quad (34)$$

That is, only the amount of fluctuation or difference $\Delta V_{CN}$ with respect to $V_{DD}/2$, not the absolute value of the control voltage $V_{CN}$, undergoes current conversion as control current $I_{CN}$ in voltage differential-current converter 64. Since the input impedance of operational amplifier OP is extremely high, control current $I_{CN}$ returns to the power supply via a feedback loop and inverting circuit 64a. When control voltage $V_{CN}$ is greater than $V_{DD}/2$ by $\Delta V_{CN}$, the current flowing to n-type MOS transistor F3 in inverting circuit 64a increases, and control current $I_{CN}$ flows from control terminal a to ground via input resistor r, the feedback loop, and transistor F3. In this case, the mirror current flows to transistor F6. When control voltage $V_{CN}$ is less than $V_{DD}/2$ by $\Delta V_{CN}$, the current flowing to p-type MOS transistor F1 in inverting circuit 64a increases, and control current $I_{CN}$ flows from the power source voltage $V_{DD}$ to control terminal a via transistor F1, the feedback loop, and input resistor r. In this case, the mirror current flows to transistor F5. Here, assuming the current strength (dimension) of transistors F5 and F6 is k times that of transistors F2 and F4, an output current $I_{CNT}$ flowing to output point P in current-current converter 66 is expressed by the relationship:

$$I_{CNT} = k \cdot I_{CN} = \pm k |\Delta V_{CN}|/r \quad (4)$$

where, k is the current-current conversion coefficient.

Converted current $I_{CNT}$ is input to current adder-subtracter 68 in the next stage. When phase locking occurs and converted current $I_{CNT}$ is zero (when control voltage $V_{CN} = V_{DD}/2$), current addition from current-current converter 66 to offset control transistor F7 or current withdrawal from lead MOS transistor F8 toward current-current converter 66 does not occur, and, therefore, the current flowing to lead MOS transistor F8 and the current flowing to offset control transistor F7 are equal to each other. The level of this current is determined by the level of offset voltage $V_{B2}$. That is, the intermediate frequency of oscillation output $V_1$ is determined by the level of offset voltage $V_{B2}$.

Next, when a phase difference occurs in the phase-locked loop, a control current $I_{CN}$ like that described above is generated. In this case, the current flowing to lead MOS transistor F8 fluctuates between positive and negative by the amount of current $I_{CNT}$, which is proportional to control current $I_{CN}$, using current $I_{OF}$, which flows to offset control transistor F7, as a reference. That is, when the control voltage is greater than $V_{DD}/2$ by a factor of $\Delta V_{CN}$, a current level $|I_{CNT}|$ is withdrawn toward current-current converter 66, thus causing a current I flowing to lead MOS transistor F8 to increase by the amount of current level $|I_{CNT}|$. When the control voltage is less than $V_{DD}/2$ by a factor of $\Delta V_{CN}$, however, current level $|I_{CNT}|$ is supplied toward current-current converter 66, thus causing current I flowing to load MOS transistor F8 to decrease by the amount of current level $|I_{CNT}|$. Here, assuming the offset current flowing to offset control transistor F7 is $I_{OF}$, then the converted current I is given by the relationship:

$$I = I_{OF} \pm k |\Delta V_{CN}|/r \quad (5)$$

Of the converted currents, offset current $I_{OF}$ is determined by offset voltage $V_{B2}$ and the fluctuation current is determined by fluctuation $\Delta V_{CN}$ of control voltage $V_{CN}$. Transistor Tr4 of current frequency converter 34 constitutes a current mirror with load MOS transistor F8, and a mirror current $I_M$ is proportional to current I. The proportional constant is determined by the dimensional ratio of load MOS transistor F8 and transistor Tr4. Current frequency converter 34 is configured based on a commonly used ring oscillator, and, therefore, the oscillation frequency is proportional to mirror current $I_M$. Assuming "m" is the proportional constant and "f" is the oscillation frequency, then according to equation (5), the oscillation frequency f is expressed as:

$$f = n \cdot m (I_O \pm k |\Delta V_{CN}|/r) \quad (6)$$

where, n is the current frequency proportional constant.

As can be seen from equation (6), since the dimensional shape of each transistor is fixed, offset current $I_{OF}$ (offset voltage $V_{B2}$) need only be changed when changing the center frequency ($f_0 = n \cdot m \cdot I_{OF}$) even if k and m remain constant. Further, using the center frequency as a reference, the frequency is changed between positive and negative by the amount of fluctuation $\Delta V_{CN}$ of control voltage $V_{CN}$ and not the control voltage $V_{CN}$ itself. Therefore, the voltage frequency conversion coefficient $K_V$ for the amount of fluctuation $\Delta V_{CN}$ of control voltage $V_{CN}$ is expressed by:

$$K_v = n \cdot mk/r \quad (7)$$

Only input resistance r need be changed when changing voltage frequency conversion coefficient $K_V$. In this embodiment, switched resistors $r_1$ and $r_2$ were provided for data transfer rates for two zones. However, $r_1$ is less than $r_2$. It is necessary to make the natural frequency $\omega_n$ large when the data transfer rate increases, but as can be seen from equation (1), only voltage frequency conversion coefficient $K_V$ need be made larger in this case, and therefore, as can be seen from equation (7), switch SW2 is changed from the resistance $r_2$ side to the resistance $r_1$ side by zone switching signal Z in order to lower the value of resistance r. Further, should the data transfer rate change, the value of resistance R in loop filter 16 is adjusted since it is necessary to maintain damping coefficient $\zeta$ constant. That is, when the data transfer rate increases, as can be seen from equation (2), the value of resistance R is dropped. Here, assuming that $R_1$ is less than $R_2$, then switch $SW_1$ is changed from the resistance $R_2$ side to the resistance $R_1$ side by zone switching signal Z.

As is made clear in equation (7), when resistance r is fixed, voltage frequency conversion coefficient $K_V$ is constant. This means that the voltage-frequency characteristic is linear. In voltage-controlled oscillators of the prior art, however, the voltage-current converter had a nonlinear characteristic (square-law curve), and the voltage frequency conversion characteristic would fluctuate when the offset voltage was changed to accommodate production deviations. Therefore, errors often occurred between design and operating values and the actual shift in phase-locking characteristics was large. However, since voltage frequency conversion characteristic $K_V$ is fixed in the above embodiment, the actual shift can be made small.

In systems in which data pulse strings $S_{IN}$ are generated at data transfer rates in three zones, four zones, or more, it is only necessary that the number of resistances in loop filter 16 and the number of input resistances in operational amplifier OP be made to conform to the different data transfer rates. Loop filter 16 (FIG. 1) in this embodiment requires resistances, but as shown in FIG. 6 of Japanese Laid-Open Patent Publication 3-68115, it can be configured with only switches and capacitors, or an active element having an equivalent electrical function can be employed.

In voltage-current converter 62 of the above voltage-controlled oscillator 60, conversion current $I_{CN}$ corresponding to fluctuation $\Delta V_{CN}$ in control voltage $V_{CN}$ is generated, and control voltage $V_{CN}$ is not a function of center frequency $f_0$ and is only controlled by offset voltage $V_{B2}$. Therefore, center frequency $f_0$ can be set independently by changing offset voltage $V_{B2}$. This is particularly significant in zone bit recording requiring a wide frequency band.

Furthermore, it is necessary to link the value of voltage frequency conversion coefficient $K_V$ to changes in the data transfer rate, but multiple external resistances $r_1$ and $r_2$ are provided as the switching means for this value, and resistances $r_1$ and $r_2$ are switched based on the zone switching signal Z. Therefore, it is also possible to independently set the voltage frequency conversion coefficient $K_V$.

It is also necessary to maintain damping coefficient $\zeta$ at the phase step response or peak shift margin characteristic point even when the data transfer rate changes, but since a means is provided for variably controlling the time constant of loop filter 16 based on zone switching signal Z, the phase-locking characteristic is not adversely affected.

The phase-locked loop of the above embodiment was configured with a CMOS integrated circuit, but bipolar transistors or other active elements can also be employed. The current frequency converter was configured with a commonly used ring oscillator, but other circuit configurations may also be employed.

Second Embodiment

Figure 3:
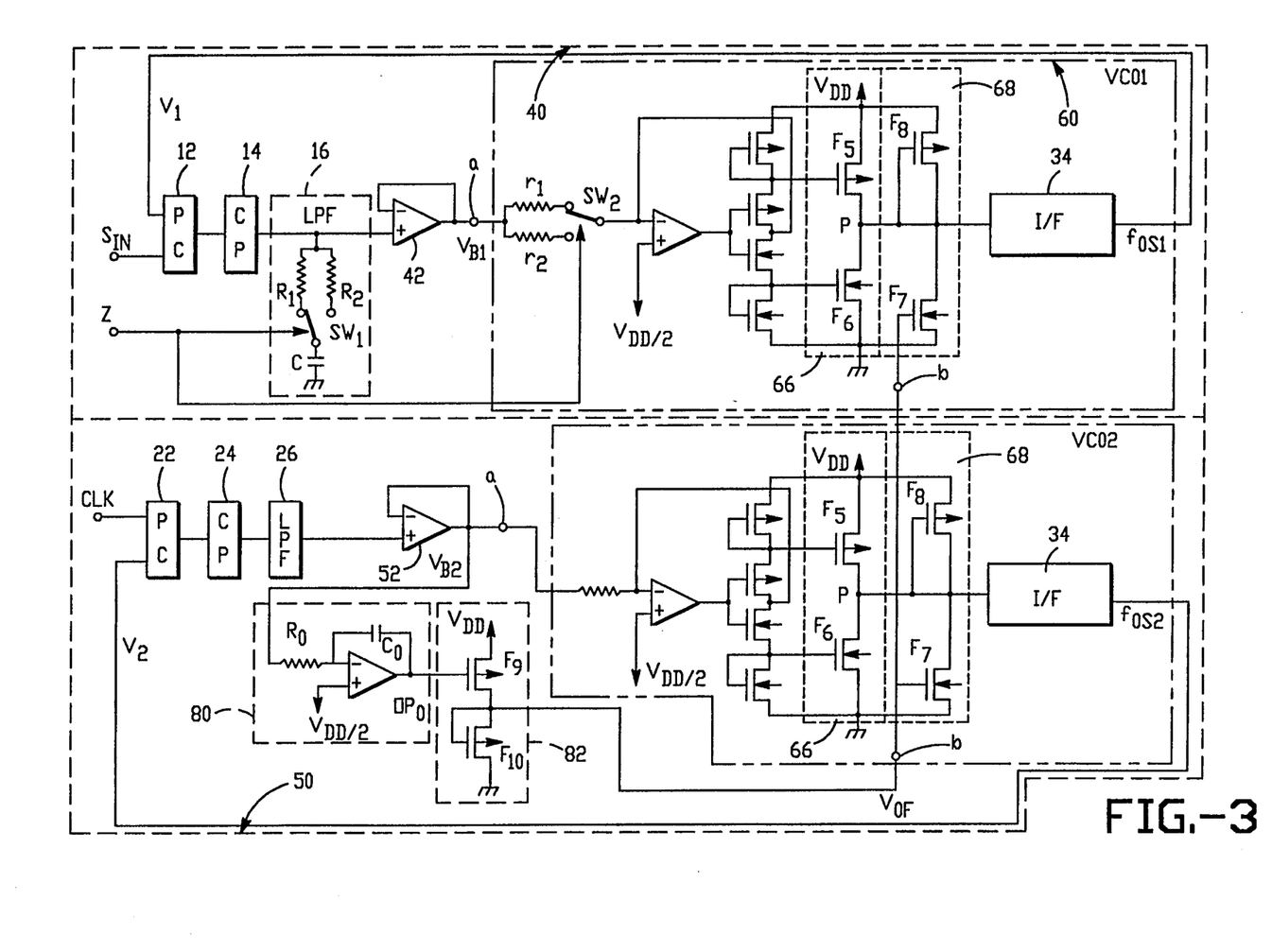
FIG. 3 is a circuit diagram showing an overall configuration for a second embodiment of the phase-locked loop of the invention.

FIG. 3 is a circuit diagram showing a phase-locked loop for a second embodiment of the invention. In this figure, the same parts as illustrated in FIG. 1 are designated by the same numbers and their explanation is omitted here. Differences in phase-locked loop 50 from the first embodiment include the addition of an integrating circuit 80 that integrates the output $V_{B2}$ of buffer 52 in second phase-locked loop 50, a polarity converter 82 that changes the polarity of the integrated output, and supplying the output of polarity converter 82 to the gates of offset control transistors $F_7$ in the current adders 68 of the first and second phase-locked loops 40 and 50. Integrating circuit 80 comprises an operational amplifier $OP_0$ having a noninverting input terminal connected to the reference voltage ($V_{DD}/2$), an input resistance $R_0$ that introduces the output of buffer 52 to the inverting input terminal of operational amplifier $OP_0$, and a feedback capacitor $C_0$ disposed between the inverting input terminal and the output terminal of the operational amplifier $OP_0$. Polarity converter 82 is made up of a series circuit comprising a p-type MOS transistor $F_9$ and an n-type MOS transistor $F_{10}$, and with the gate and drain of the transistor $F_{10}$ connected together.

In considering the polarity converting action of polarity converter 82, offset voltage $V_{OF}$ based on the output of integrating circuit 80, which receives output voltage $V_{B2}$ of buffer 52 as an input voltage, is proportional to the integrated value of the voltage difference between input voltage $V_{B2}$ and reference voltage $V_{DD}/2$, using reference voltage $V_{DD}/2$ as a baseline. The proportional constant is given by the ratio $1/C_0R_0$. When output voltage $V_{B2}$ of buffer 52 is larger then reference voltage $V_{DD}/2$, a value obtained by adding the integrated value (average value) of the voltage difference to $V_{DD}/2$ becomes the offset voltage, and, therefore, the current that flows to offset transistor $F_7$ is controlled so that it also becomes large. Further, when output voltage $V_{B2}$ of buffer 52 is smaller than reference voltage $V_{DD}/2$, a value obtained by subtracting the integrated value (average value) of the voltage difference from $V_{DD}/2$ becomes the offset voltage, and, therefore, the current that flows to offset transistor $F_7$ is controlled so that it also becomes small. As in the first embodiment, current I flowing to transistor $F_8$ is the sum of offset current $I_{OF}$ flowing to transistor $F_7$ and the converted current $\pm k |\Delta V_{CN}|/r$ flowing to output point P. Current frequency converter 34 also oscillates at a frequency proportional to current I. When the average level of output voltage $V_{B2}$ of buffer 52 is larger than reference voltage $V_{DD}/2$, i.e., when the phase of oscillation frequency $f_{OS2}$ is delayed behind the phase of reference clock CLK, the offset current of transistor $F_7$ becomes large, and as a result, the phase of the output of current frequency converter 34 is controlled so that it advances, thus, causing the average level of output voltage $V_{B2}$ to become smaller. When the average level of output voltage $V_{B2}$ of buffer 52 is smaller than reference voltage $V_{DD}/2$, i.e., when the phase of oscillation frequency $f_{OS2}$ is advanced past the phase of reference clock CLK, the offset current of transistor $F_7$ becomes small, and, as a result, the phase of the output of current frequency converter 34 is controlled so that it is delayed, thus, causing the average level of output voltage $V_{B2}$ to become larger. In this manner, the average level of output voltage $V_{B2}$ of buffer 52 is continually controlled so that it equals reference voltage $V_{DD}/2$. Therefore, since the output of the loop filter having an AC component is not saturated and the offset voltage impressed on offset terminal b can be varied linearly, a phase-locked loop capable of following a wide frequency range is realized. Accordingly, this is significant in application to phase-locked loops of hard disk devices that utilize a wide range of data transfer rates.

What is claimed is:

1. A voltage-controlled oscillator having a voltage-current conversion apparatus that generates a converted current proportional to the level of an input voltage and a current frequency conversion apparatus that generates an oscillation frequency output corresponding to the level of the converted current, wherein the voltage-current conversion apparatus comprises:

voltage differential-current conversion means comprising a voltage-current conversion switching means for selecting a conversion coefficient in response to a switching signal, said voltage differential-current conversion means for receiving the input voltage as a first input voltage and for converting it to a current in proportion to a difference between the input voltage and a reference voltage, the proportional coefficient of the converted current corresponding to the conversion coefficient; and current adder-subtracter means for generating a second current proportional to a second input voltage and for generating the converted current by adding or subtracting a first current based on the current generated by the voltage differential-current conversion means and the second current.

2. The voltage-controlled oscillator of claim 1, wherein the voltage differential-current conversion means comprises current-current conversion means for generating the first current proportional to the current generated by the voltage differential-current conversion means.

3. A phase-locked loop circuit having a first phase-locked loop that synchronizes to a data pulse string and a second phase-locked loop that synchronizes to a reference clock; wherein voltage-controlled oscillators in the first and second phase-locked loops comprise:

voltage-current conversion means for generating an output current proportional to the level of an input voltage;

current frequency conversion means for generating an oscillation frequency output proportional to the level of the output current; and wherein the voltage-current conversion means comprises:

voltage differential-current conversion means comprising a voltage-current conversion switching means for selecting a conversion coefficient in response to a switching signal, said voltage differential-current conversion means for receiving the input voltage as a first input voltage and converting it to a current proportional to a voltage difference between the input voltage and a reference voltage, the proportional coefficient of the converted current corresponding to the conversion coefficient; and current adder-subtracter means for providing a second current proportional to a second input voltage and for generating the output current by adding or subtracting a first current based on the current generated by the voltage differential-current conversion means and the second current.

4. The phase-locked loop circuit of claim 2, wherein the voltage differential-current conversion means comprises current-current conversion means for generating the first current, which is proportional to the current generated by the voltage differential-current conversion means.

* * * * *

UNITED STATES PATENT AND TRADEMARK OFFICE
CERTIFICATE OF CORRECTION

Patent No.: 5,359,298  
Dated: October 25, 1995  
Inventors(s): Akira Abe

Page 1 of 5

It is certified that error appears in the above-identified patent and that said Letters Patent is hereby corrected as shown below:

Delete Drawings Sheets 1-5, and substitute therefor the Drawing Sheets, consisting of Figs. 1-5, as shown on the attached pages.

Signed and Sealed this

Twenty-eighth Day of November 1995

Attest:

BRUCE LEHMAN

*Attesting Officer*  *Commissioner of Patents and Trademarks*